United States Patent [19]

Raush et al.

[11] Patent Number: 4,709,716

[45] Date of Patent: Dec. 1, 1987

[54] RINSE TANK

[75] Inventors: Russell G. Raush; Raymond A. Alleman, both of Lancaster, Pa.

[73] Assignee: RCA Corporation, Princeton, N.J.

[21] Appl. No.: 907,976

[22] Filed: Sep. 16, 1986

[51] Int. Cl.$^4$ .............................................. B08B 3/04
[52] U.S. Cl. .............................................. 134/122 R
[58] Field of Search ............... 134/64 R, 64 P, 122 R, 134/122 P; 354/319, 320, 321, 322, 324, 325; 118/411, 419, 424, 427, 429; 68/43, 44, 45, 175, 181 R, DIG. 1

[56] References Cited

U.S. PATENT DOCUMENTS

| 2,424,034 | 7/1947 | Hopper | 118/429 X |
| 3,192,846 | 7/1965 | Wright | 134/122 P |
| 3,372,630 | 3/1968 | Schmidt | 354/321 X |
| 4,199,966 | 4/1980 | Winch | 68/181 R X |
| 4,270,317 | 6/1981 | Kurie | 134/64 R X |
| 4,577,949 | 3/1986 | Geyken et al. | 134/122 P X |
| 4,591,169 | 5/1986 | Raush | 277/135 |

FOREIGN PATENT DOCUMENTS 7907239  3/1981  Netherlands ..................... 68/181 R Primary Examiner—Philip R. Coe
Attorney, Agent, or Firm—E. M. Whitacre; D. H. Irlbeck; L. L. Hallacher

[57] ABSTRACT

A rinse tank for rinsing residue from fine apertures in a moving strip of material includes a chamber having an elongated slot. The slot has a length sufficient to span the aperture pattern. Fluid is injected into the chamber and exits through the slot as a fluid curtain substantially normal to one side of the strip. Fluid is also passed over the other side of the strip substantially parallel to the fluid curtain. The combined fluid actions cause the fluid to flow into the small apertures to remove any residue from the apertures.

6 Claims, 3 Drawing Figures

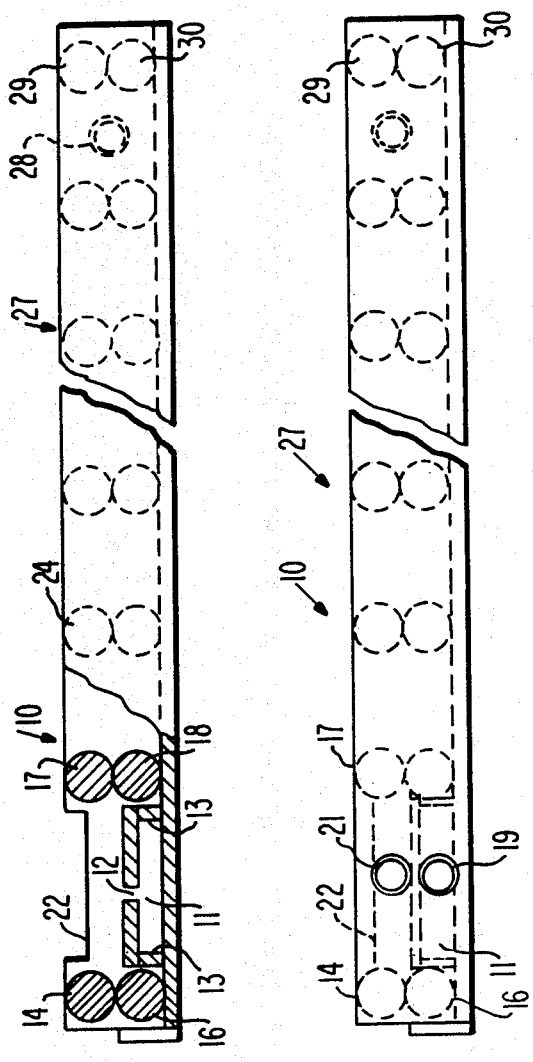

RINSE TANK

BACKGROUND

This invention relates generally to rinse tanks and particularly to a rinse tank for rinsing residue from fine apertures in a moving strip of material.

Many thin metal items, such as shadow masks for color picture tubes, are made by acid etching. In such etching a pattern of a part to be etched is photographically produced on a photoresist material which is coated onto the metal. The photoresist material is exposed to light through a transparent medium bearing the opaque pattern. The unexposed portion of the photoresist material is washed away leaving bare metal along the pattern, while the exposed material protects the metal from the acid. Typically, a large number of the patterns are photographically produced on a long strip of metal which is horizontally pulled through an acid etch tank. The acid in the etch tank etches through bare metal to produce the desired part. Frequently, the pattern is produced on both sides of the metal strip and the etching occurs on both sides.

The metal strip moves continuously through the etch tank. After etching is completed and the strip exits from the tank a large amount of acid clings to the photoresist material on both sides of the strip. It is essential that this acid be removed as soon as possible. Typically, the acid is removed by spraying the strip with a rinsing solution in a spray chamber. The rinsing solution typically is either clean water or an alkaline solution which neutralizes the acid. Also, after the metal strip is rinsed with the alkaline material it is further rinsed with fresh water to remove the alkaline rinse.

When the parts being etched are shadow masks for high resolution visual displays, the apertures in the shadow mask are very fine. Accordingly, the spraying of the rinsing fluid onto the shadow mask does not cause the rinsing fluid to fully enter the apertures and residue in the apertures, therefore, is not fully washed away. For this reason, there is a need for a rinse tank which forces the rinsing fluid into the fine apertures to more fully remove residue from the apertures.

SUMMARY

A rinse tank for rinsing residue from fine apertures in a moving strip of material includes a chamber having an elongated slot which spans a strip passing in the proximity of the chamber. A first fluid inlet means provides fluid to the chamber whereby fluid exits the elongated slot as a fluid curtain substantially normal one side of the strip. A second fluid inlet means is arranged in the proximity of the elongated slot and provides fluid to the tank and on the other side of the strip. The second fluid inlet means is positioned so that exiting fluid creates a fluid flow substantially parallel to the elongated slot whereby fluid flow into the fine apertures is enhanced and enhances the rinsing of residue from the apertures.

BRIEF DESCRIPTION OF THE DRAWINGS

FIG. 2 is a side view, broken away and partially in cross section along line 2—2 of FIG. 1.
FIG. 3 is a side view, broken away, of the preferred embodiment of FIG. 1.

DETAILED DESCRIPTION

Figure 1:
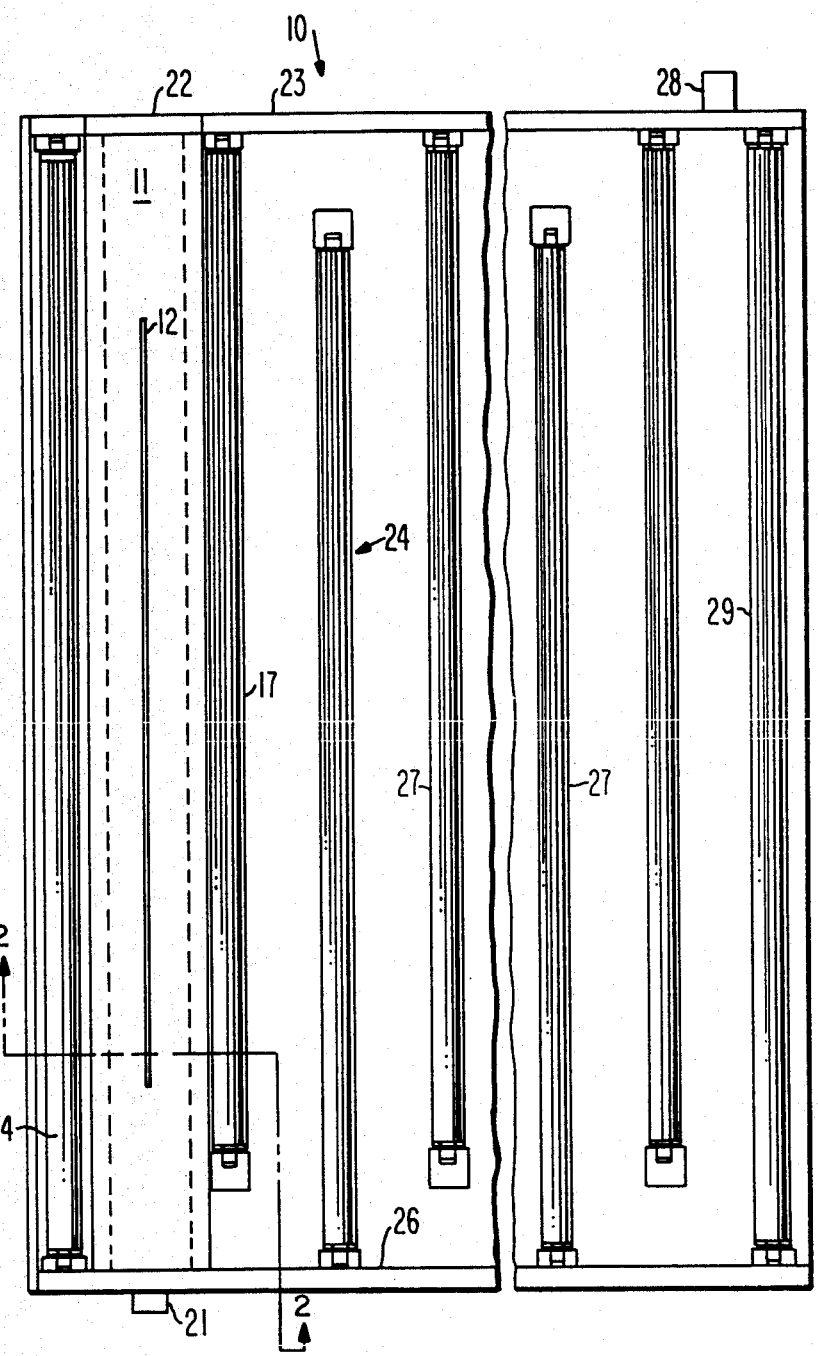
FIG. 1 is a top view of a preferred embodiment.

In FIGS. 1 and 2, a rinse tank 10 includes a chamber 11 having an elongated slot 12. The elongated slot 12 has a length which exceeds the width of an aperture pattern etched into a strip of material (not shown) being pulled through the rinse tank so that the entire aperture pattern is washed with rinsing fluid exiting from the slot 12. In FIG. 2, the chamber 11 includes two sides 13, and the bottom of the chamber is the bottom of the rinse tank 10. A pair of rollers 14 and 16 span the entire transverse width of the rinse tank 10, at the input end of the tank. The rollers 14 and 16 contact one another to prevent vertical motion the strip of material being pulled between the rollers. A second pair of rollers 17 and 18 is immediately adjacent to, and substantially parallel to, the other side of chamber 11. As shown in FIG. 1, the rollers 17 and 18 span a substantial portion of the transverse width of the rinse tank 10 so that the entire width of the strip is pulled between the rollers. The rollers 17 and 18 are dimensioned so that their combined diameters substantially equals, or exceeds, the fluid level within the rinse tank 10. The rollers 17 and 18 also contact one another, at the same level as the two rollers 14 and 16. The level at which the roller pairs 14, 16 and 17, 18 contact is selected to be spaced a very short distance from the top surface of the chamber 11, and thus in the close proximity of the elongated slot 12. The contact level of the rollers is also selected to retain the strip beneath the fluid in the rinse tank.

In FIG. 3, a first fluid inlet 19 is arranged to provide fluid to the chamber 11. A second fluid inlet 21 is arranged immediately above the first fluid inlet 19 at a level which causes fluid to run across the top surface of a strip being pulled between the roller pairs. The fluid from the inlet 19 flows in a direction substantially parallel to the elongated slot 12. A recess 22 is formed in one side 23 of the rinse tank 10. The depth of the recess determines the fluid level within the rinse tank 10. Fluid injected into the chamber 11 through the inlet 19 exits from the chamber through the elongated slot 12 in the form of a fluid curtain which impacts the bottom surface of a strip being pulled between the roller pairs. The fluid curtain is substantially normal to the plane of the strip and to the transverse dimension of the strip. The fluid admitted to the rinse tank 10 through the second fluid inlet 21 creates a cross current across the surface of the strip. The combined actions of the cross current and fluid curtain from the elongated slot 12 cause the rinsing fluids to flow into, and around, the fine apertures within the strip to substantially enhance removal of residue from the apertures.

In FIGS. 1 and 2, another pair 24 of rollers is fixed to the side 26 of the rinse tank 10 and extends for a substantial portion of the transverse width of the rinse tank to ensure that the full strip of material passes between the rollers. The other end of the roller pair 24 is spaced from the side 23 to which the rollers 17 and 18 are coupled. Additional pairs of rollers 27 are spaced along the length of the tank between the second inlet 21 and a third fluid inlet 28. Adjacent roller pairs are attached to opposite sides of the rinse tank so that the rollers pairs are staggered along the length of the rinse tank 10. As stated above, the roller pairs are dimensioned so that their combined diameters substantially equals the desired depth of the fluid within the rinse tank. Accordingly, very little fluid can pass beneath the rollers, or over the rollers, so that the staggering causes fluid entering the rinse tank through a third inlet 28 to follow a labyrinth, or serpentine, path along the length of the tank. The clean rinsing fluid enters the rinse tank at the point where the strip of material exits from the rinse tank so that the cleanest fluid is used to rinse the strip just as the strip leaves the tank. The number of pairs 27 of rollers is determined by the length of the rinse tank, and is determined by the space available for installing the tank. The tank 10, therefore, is shown broken in FIGURES 1, 2 and 3. The rollers 17 and 18 are arranged so that they are spaced from the side 26 of the rinse tank which supports the fluid inlet 21. Accordingly, the labyrinth flowing fluid from the inlet 28 turns around the roller pair 17 and 18 and joins the fluid entering through the fluid inlet 21. The combining of the two fluids substantially increases the velocity of the fluid flowing over the strip and enhances the flow of fluid within the fluid curtain from the elongated slot 12 into the fine apertures of the strip. A pair of rollers 29 and 30 completely spans the transverse width of the rinse tank 10 at the output end of the tank. The rollers 14, 16 and 29, 30 can be included in seal arrangements of the type described in U.S. Pat. No. 4,591,169.

What is claimed is:

1. A rinse tank for rinsing residue from fine apertures in a moving strip of material comprising:

a chamber having an elongated slot for spanning said strip when said strip passes in the proximity of said chamber;

first fluid inlet means for providing fluid to said chamber whereby fluid exits said elongated slot as a fluid curtain substantially normal one side of said strip;

second liquid inlet means arranged in the proximity of said elongated slot for providing fluid to said tank and on the other side of said strip, said second fluid inlet means being positioned so that fluid exiting said second inlet means creates a fluid flow substantially parallel to said elongated slot whereby fluid flow into said fine apertures is enhanced and enhances the rinsing of residue form said apertures;

third fluid inlet means, spaced from said second fluid inlet means along the length of said rinse tank; and a plurality of pairs of rollers for holding said strip beneath said fluid, said pairs of rollers being staggered between second and third fluid inlet means whereby fluid from said third inlet means follows a labyrinth path prior to joining fluid from said second fluid inlet means.

2. The rinse tank of claim 1 wherein said strip of material contains shadow masks for kinescopes, and wherein said residue is the acid used to etch said shadow masks.

3. The rinse tank of claim 2 further including means for maintaining the fluid in said tank at a preselected level.

4. The rinse tank of claim 1 further including means for maintaining the fluid in said tank at a preselected level.

5. The rinse tank of claim 1 wherein said pairs of rollers are vertically arranged, and are dimensioned so that their combined diameters substantially equal the fluid level in said tank; and wherein said pairs of rollers extend substantially normal to the length of said tank and across a substantial portion of the width of said tank.

6. The rinse tank of claim 5 further including means for maintaining the fluid in said tank at a preselected level.

* * * * *